US011488664B2

(12) United States Patent
Mackin et al.

(10) Patent No.: US 11,488,664 B2
(45) Date of Patent: Nov. 1, 2022

(54) DISTRIBUTING DEVICE ARRAY CURRENTS ACROSS SEGMENT MIRRORS

(71) Applicant: International Business Machines Corporation, Armonk, NY (US)

(72) Inventors: Charles Mackin, San Jose, CA (US); Pritish Narayanan, San Jose, CA (US); Geoffrey Burr, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 17/068,852

(22) Filed: Oct. 13, 2020

(65) Prior Publication Data

US 2022/0115067 A1  Apr. 14, 2022

(51) Int. Cl.
*G06N 3/08* (2006.01)
*G11C 13/00* (2006.01)

(52) U.S. Cl.
CPC .......... *G11C 13/0038* (2013.01); *G06N 3/08* (2013.01); *G11C 13/0069* (2013.01); *G11C 13/003* (2013.01)

(58) Field of Classification Search
CPC ............ G11C 13/0038; G11C 13/0069; G11C 13/003; G06N 3/08
USPC ....................................................... 711/104
See application file for complete search history.

(56) References Cited

U.S. PATENT DOCUMENTS

| | | |
|---|---|---|
| 10,409,889 B2 | 9/2019 | Fick |
| 10,453,528 B1 | 10/2019 | Burr |
| 2018/0253643 A1 | 9/2018 | Buchanan |
| 2019/0156181 A1 | 5/2019 | Marukame |
| 2019/0164033 A1* | 5/2019 | Khapali ............... G06N 3/0635 |
| 2019/0197392 A1* | 6/2019 | Leobandung ........ G06N 3/0445 |

(Continued)

FOREIGN PATENT DOCUMENTS

| | | |
|---|---|---|
| CN | 103927290 A | 7/2014 |
| CN | 107609576 A | 1/2018 |

(Continued)

OTHER PUBLICATIONS

Mell et al., "The NIST Definition of Cloud Computing", Recommendations of the National Institute of Standards and Technology, Special Publication 800-145, Sep. 2011, 7 pages.

(Continued)

*Primary Examiner* — Ly D Pham
(74) *Attorney, Agent, or Firm* — David K. Mattheis; Maeve M Carpenter

(57) ABSTRACT

Distributing multiply-accumulate currents across segment mirrors by providing a circuit including an array of resistive elements, the array including rows and columns and first stage current mirrors, each of the first stage current mirrors being electrically coupled to a segment, wherein the segment comprises a columnar subset of the resistive elements, providing, by the array, a vector of current outputs equal to an analog vector-matrix product between a vector of voltage inputs to the array and a matrix of analog resistive weights within the array, wherein the voltage inputs encode a vector of analog input values, wherein each row of resistive elements corresponds to a specific voltage input, determining a score for each of the rows, determining a ranking of the rows of the array according to the score of each row, and mapping each row to a segment according to the ranking.

25 Claims, 5 Drawing Sheets

(56) References Cited

U.S. PATENT DOCUMENTS

2020/0334525 A1* 10/2020 Tsai .................. G06N 3/0481
2020/0356848 A1* 11/2020 Lesso ................ G11C 13/0069

FOREIGN PATENT DOCUMENTS

CN    110704799 A    1/2020
CN    111242277 A    6/2020

OTHER PUBLICATIONS

International Search Report and Written Opinion dated Dec. 31, 2021 from International Application No. PCT/EP2021/075010.
Li et al., "Build Reliable and Efficient Neuromorphic Design with Memristor Technology", Jan. 21, 2019, pp. 224-229, XP058424582.
Xia et al., "Fault-Tlerant Training with On-time Fault Detection for RRAM-Based Neural Computing Systems", Jun. 18, 2017, pp. 1-6, XP058367801.

* cited by examiner

DISTRIBUTING DEVICE ARRAY CURRENTS ACROSS SEGMENT MIRRORS

BACKGROUND

The disclosure relates generally to balancing the distribution of multiply-accumulate (MAC) currents across segment mirrors. The disclosure relates particularly to distributing MAC currents across segment mirrors by shuffling the MAC operation weights and activations associated with the currents.

Charge-based analog multiply-accumulate (MAC) operations may require a large number (e.g., one current for each of 512 MAC rows) of "multiply" currents to be accumulated onto an edge capacitor. The accumulate operation may occur in segments (e.g., 64 rows per segment), where each segment current is scaled down using a current mirror. Scaling down the overall MAC current into segment currents using the current mirror enables the accumulation of segment currents using smaller edge capacitors (reducing capacitor element area) and avoids exceeding the dynamic range of the voltage that can effectively be read off of the capacitor.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatuses and/or computer program products enable more uniform distribution of MAC currents by shuffling MAC stored weights and the associated currents.

Aspects of the invention disclose methods, systems and computer readable media associated with distributing multiply-accumulate currents across segment mirrors by providing a circuit including an array of resistive elements, the array including rows and columns and first stage current mirrors, each of the first stage current mirrors being electrically coupled to a segment, wherein the segment comprises a columnar subset of the resistive elements, providing, by the array, a vector of current outputs equal to the analog vector-matrix product between a vector of voltage inputs to the array and a matrix of analog resistive weights within the array, wherein the voltage inputs encode a vector of analog input values, wherein each row of resistive elements corresponds to a specific set of input voltages, determining a score for each of the rows, determining a ranking of the rows of the array according to the scores, and mapping each row to a segment according to the ranking.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

Artificial neural networks (ANNs) are distributed computing systems, which generally include a number of neurons interconnected through connection points called synapses. Each synapse encodes the strength of the connection between the output of one neuron and the input of another. The output of each neuron is determined by the aggregate input received from other neurons that are connected to it. Thus, the output of a given neuron is based on the outputs of connected neurons from the preceding layer and the strength of the connections as determined by the synaptic weights. An ANN is trained to solve a specific problem (e.g., pattern recognition) by adjusting the weights of the synapses such that a particular class of inputs produce a desired output.

ANNs may be implemented on various kinds of hardware, including crossbar arrays, also known as crosspoint arrays or crosswire arrays. A basic crossbar array configuration includes a set of conductive row wires and a set of conductive column wires formed to intersect the set of conductive row wires. The intersections between the two sets of wires are separated by crosspoint devices. Crosspoint devices function as the ANN's weighted connections between neurons.

Figure 1:
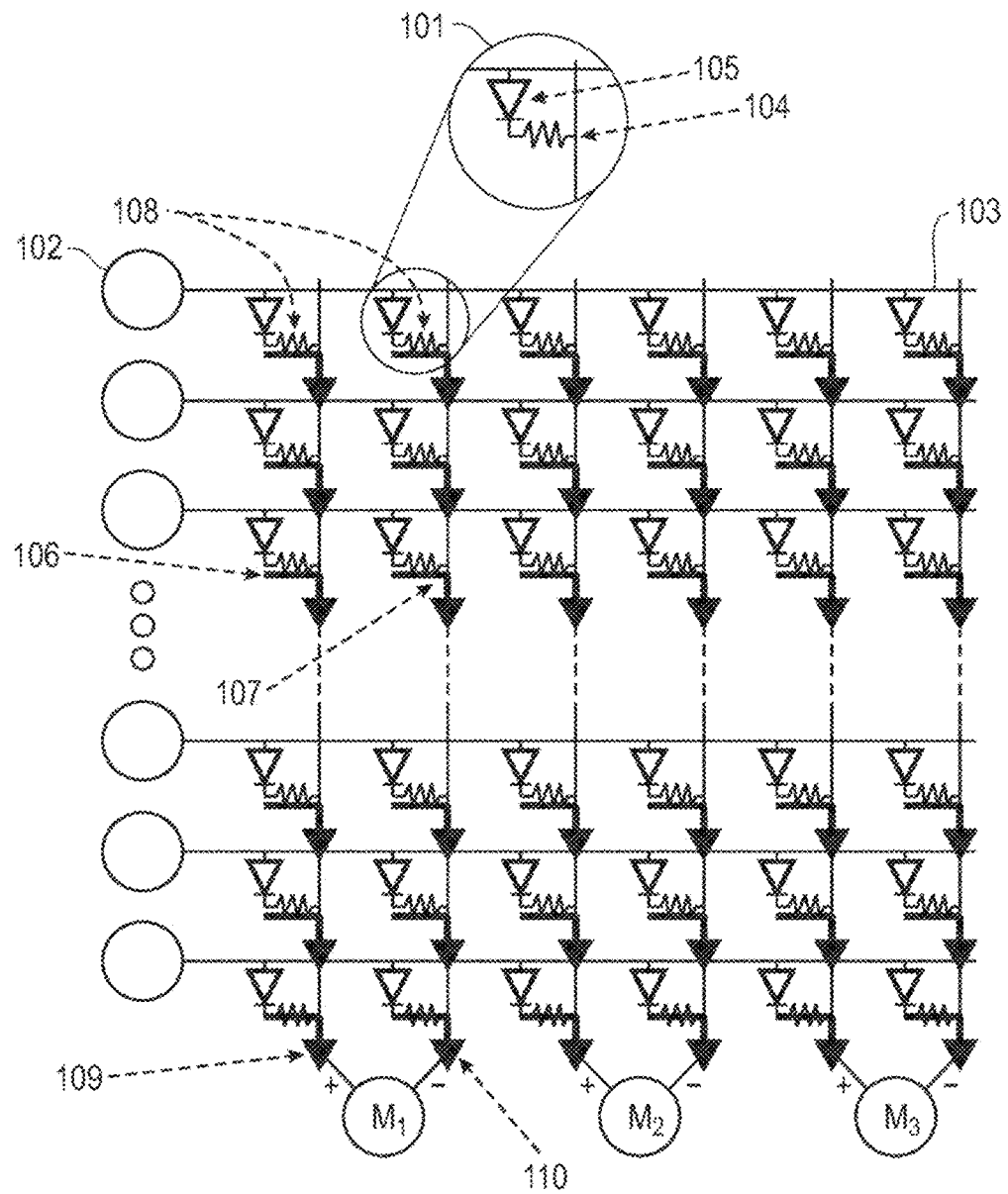
FIG. 1 provides a schematic illustration of a crossbar memory device, according to an embodiment of the invention.

FIG. 1 illustrates an exemplary nonvolatile memory-based crossbar array, or crossbar memory. Row lines 102 form a plurality of junctions 101 by intersecting column lines 103. A resistive memory element 104, such as a non-volatile memory, is in series with a selector 105 at each of the junctions 101, coupling between one of the row lines 102, and one of the column lines 103. The selector may be a volatile switch or a transistor, various types of which are known in the art.

Mapping the exemplary synapses of a neural network onto the crossbar array of FIG. 1, the current at the output 106, 107 of each junction is given as I=G^+V(t) and I=G^−V(t) where G^+ and G^− correspond to w_ij for the given resistive memory, and V(t) correspond to x_i for the given input row line. In this example, the column lines are arranged in adjacent conductance pairs 108. The aggregate outputs 109, 110 are thus given as $1=\Sigma G^+ V$ and $1=\Sigma G^- V$ for each conductance pair 108. Segment current mirrors $M_1$, $M_2$, $M_3$, connect aggregated outputs to edge capacitors (not shown).

In such crossbar memories, the aggregate output current can be extremely high. In addition, large voltage drops and electromigration may lead to a loss of functionality of the array. Moreover, to sense a single input device or crosspoint (rather than the aggregate read current from many devices), downstream peripheral circuitry would need to have a very high dynamic range.

In particular, for neuromorphic and other applications such as vector-matrix multiplication, a crossbar memory is not well adapted to situations in which input signal current from any one device is already significant enough to be measurable. In such a situation, the aggregate signal from all such devices can be far too large, swamping any reasonable capacitor at the periphery. While a below-unity current gain can be applied at the periphery before applying this current to an integrating capacitor, additional problems arise. For instance, a large aggregate current can overload the row lines and column lines to the extent that undesired voltage drops are introduced. In some circumstances, damage by electromigration may result.

Utilizing segment current mirrors enables the segmentation of an overall MAC current into more easily managed current segments. Performing the accumulate operations in segments enables the use of smaller edge capacitors, reducing the capacitor element spatial requirements and lessening the likelihood of exceeding the dynamic range of the capacitor's voltage. Segment mirrors may be tied together in a parallel circuit structure. This circuit structure may introduce hardware constraints on the execution of the segmented accumulate operations. Such constraints may include non-linearities, and capacitor voltage range constraints, and may lead to analog MAC inaccuracies under operating conditions where the current distribution across the set of accumulate segment current mirrors lacks uniformity. Disclosed embodiments enable the shuffling of MAC stored weights associated with accumulate segment currents. The shuffling of the weights yields an overall accumulate operation current more uniformly distributed across the set of accumulate segment current mirrors.

In an embodiment, the method determines an indexing order for mapping the rows of a matrix of values to the rows of resistive elements of a MAC structure. In this embodiment, the matrix of values may relate to the network node weightings of a trained neural network, each column of the matrix corresponding to the synaptic node weights of one neuron of a layer of the multi-layer neural network. In providing a trained neural network for use, the method seeks to map the synaptic node weights derived during the network training epochs to hardware circuitry, the elements of the circuitry taking on values associated with the respective node weights.

In an embodiment, the circuitry includes rows and columns of resistive elements such as resistive non-volatile memory elements, phase-change memories, electrochemical memories, spin-transfer torque RAMs, resistive RAMs, conductive-bridging RAMs, and similar resistive structures. The method may map analog values associated with the node weights or may map digitized values associated with analog weights to the resistive memory elements.

Training a neural network determines node weight values for each node of each layer of the network. The node weights are adjusted during training epochs to minimize a loss function for the network. At the completion of the training, the node weight values are fixed and subsequently utilized in the evaluation of input test data. The set of node weights for the network are embodied in an array of values.

Training the neural network also yields an array input vector including a value associated with each row of the weight array. The vector values include the row activation values for each row of the array of weights. In the device, the array inputs translate as row input voltages, the voltage applied to all resistive elements of a row and generating column currents through each resistive element. The device structure leads to an aggregated current, each resistive element of the column adding a column current dependent upon the particular weight (resistance) of the element and the specific activation (voltage) of the row. A device having 512 rows may aggregate 512 individual column currents yielding an excessively large overall aggregated columnar current.

To reduce overall aggregated columnar currents for any single column of resistive elements, the hardware device may have columnal segments, wherein the hardware design subdivides each column into multiple segments of resistive elements. The individual columnar segment currents are drawn off without further aggregation. As an example, a column of 512 resistive elements may be divided into eight segments, each segment including 64 resistive elements. The hardware may include first stage current mirror elements associated with each segment and connecting the segment to an edge capacitor for receiving the aggregated segment current upon application of the appropriate row input voltage. For the example, the device draws off eight aggregated columnar segment currents for each column at the first stage current mirror, one current corresponding to each of the columnar segments of each column. Second stage current mirrors may be utilized to determine if current is added to or subtracted from the associated edge capacitor.

In mapping the node weights to the circuitry, the method seeks to balance the aggregated segment currents across the set of segments of each column to prevent the buildup of excessive aggregated segment currents for any particular segment. Preventing excessive currents reduces the likelihood of the current mirror circuitry entering more non-linear regimes, which could adversely affect the MAC computation.

In an embodiment, one or more components of the system can employ hardware and/or software to solve problems that are highly technical in nature (e.g., scoring rows of an array of values according to one or more of the array row weights and the array row activation input value, ranking the scored rows according to the scores, mapping the ranked rows to the rows of a device to balance columnar segment currents across the columns of resistive elements of the device, etc.). These solutions are not abstract and cannot be performed as a set of mental acts by a human due to the processing capabilities needed to facilitate MAC current balancing, for example. Further, some of the processes performed may be performed by a specialized computer for carrying out defined tasks related to balancing memory currents. For example, a specialized computer can be employed to carry out tasks related to balancing MAC device currents or the like.

In an embodiment, a hardware device includes an array of resistive elements in a row and column crossbar arrangement. As an example, the device may include an array of 512 rows, each row including 512 columns. Current mirror elements subdivide the set of resistive elements of each of the columns into subsets or segments of resistive elements— as an example, the first stage current mirrors divide the 512 rows of each column into eight segments of 64 resistive elements for each segment. As noted above, the resistive elements of the array may comprise resistive elements such as resistive non-volatile memory elements, phase-change memories, electrochemical memories, spin-transfer torque RAMs, resistive RAMs, conductive-bridging RAMs, and similar resistive structures capable of carrying an analog or digital mapping of resistance values corresponding to an array of values. As an example, the array of resistive elements may carry a mapping of values ranging from 100 nano siemens to 10 micro siemens, corresponding to a range of array values in terms of conductance (resistance). The array of values may in turn, correspond to the weightings of a trained neural network.

The vector-matrix product resulting from application of a vector of voltage inputs to the resistive element values of the array represents a vector of current outputs. The vector of voltage inputs encodes a vector of analog input values—such as neural network activation values. The vector of voltage inputs includes a distinct voltage input value for each row of the resistive element array. In an embodiment, the voltage input values of the vector correspond to the columnar current outputs from a separate resistive element array upstream in the circuit.

In an embodiment, the method maps the synaptic weights for a layer of a trained neural network to the resistive elements of the array of the device. Each resistive element mapping to a single synaptic weight within the layer of trained weights. The method translates the weight values to conductance (resistance) values within the dynamic range of the device resistive elements. The method further translates the range of network layer activation values into input voltages for each layer yielding the vector of input voltages for the array of the device.

The method determines a score for each row of values after mapping input array values to device resistive elements and row activation values to voltage input vectors. The score may be determined according to the voltage input values for the row, the sum of the resistances of the resistive elements across the row, or the combination of the voltage and the resistance—the sum of the currents resulting from the application of the row's input voltages to each resistive element of the row.

In response to determining the row scores, the method ranks the rows of the array according to the determined score, from highest score to lowest score. The method then applies a sorting algorithm to the ranked listing of row scores, sorting the listing into the set of array columnar segments to achieve a balanced aggregate row score for each segment. In an embodiment, the sorting algorithm places the highest ranked row into a first segment, the next highest ranked row into the next segment and so on for the highest ranked N rows into N segments. To balance the aggregate row score across the N segments, the algorithm then reverses the order of placement, placing the N+1 ranked row in the Nth segment and proceeding until placing the 2N ranked row in the first segment. The method proceeds with indexing the rows into the N segments until all rows are placed in a segment. After an initial sorting, the method determines an aggregate row score for each segment and also determines aggregate columnar currents for each segment of each column of the array of resistive elements. After these determinations, the method resorts the rows to reduce discrepancies between aggregate segment row scores and/or aggregate columnar currents. In resorting, the algorithm considers the effects of swapping any pair of rows between segments having differences between aggregate row scores or aggregate columnar segment currents. The method considers the effect upon all the columnar segment currents across the two segments contributing rows to the swap as swapping rows potentially impacts the aggregate columnar segment current of each columns of each segment.

In an embodiment, the method considers the difference between aggregate row scores for two segments, the relative contribution of each row of each segment to the aggregate row score for that segment, the columnar segment aggregate currents for each column of each segment and the relative contribution of each row to those calculated or measured columnar segment aggregated currents. In an embodiment, the method considers the rows of two segments ate a time in balancing the aggregated row scores and aggregated columnar segment currents. In an embodiment, the method considers all rows and columns of all segments in identifying suitable rows for swapping to reduce the differences in aggregated columnar segment currents and/or aggregated segment row scores. The method may seek to balance the columnar segment currents, the row scores, or both. In an embodiment, the method prioritizes the balancing of the aggregated columnar segment currents over the balancing of the aggregated segment row scores.

In an embodiment, the method maps the resistance values from the translation of node weights to the resistive elements of the device, applies the activation inputs translated as row voltages, and measures the columnar segment currents for each column of the device array. In an embodiment, the method proceeds virtually, calculating the columnar segment currents according to the input voltages and resistive element resistances without the actual application of voltages to the device.

In an embodiment, the method derives the vector of input voltages for the rows of the array of resistive elements from input or test data presented for analysis by the trained network embodied in the device hardware. In this embodiment, the input data may comprise analog values or digital data converted to analog values by the method using a digital to analog converter. Input data may include images, character strings, documents, etc., presented to the network for classification etc. The method applies the vector of values corresponding to the input data as voltages to the array of resistive elements corresponding to the input layer of the neural network. In an embodiment, after mapping the weights of the trained network to the hardware circuits, input data is passed to the hardware for evaluation. The vectors associated with each input data object—documents, character strings, images, etc., vary as the input data varies.

In an embodiment, the method derives the vector of input voltages for each layer after the input layer according to the columnar currents of the preceding layer. The columnar currents of a first upstream layer determine the row input voltages of a second, downstream layer. The columnar currents from the input layer determine the row input voltages for the next layer after the input layer, and so on. Each column of the preceding layer maps to a corresponding row of the next layer. The current from each column determines the input voltage for the corresponding layer. In this embodiment, as the method maps ranked rows of resistive values associated with the input data array, the method also maps the columns of the preceding array of resistive elements to correspond with the mapping of ranked rows. As an example, the method ranks a row of resistive values to row 64 of the array of resistive elements, the method concurrently maps the column from the preceding array of resistive elements, or the value from the vector of input data values, to correspond with row 64 of the arrays of resistive elements. Due to the concurrent mapping of rows and associated preceding columns, the method maintains the relationships between rows and associated row input voltages. Swapping rows alters the sequence of columnar elements and potentially alters aggregate segment currents and aggregate segment row scores. Swapping column positions to match downstream row mappings does not alter row scores as the resistive elements of a column remain in sequence as columns are swapped. In use, the method maps vectors derived from input data to the rows of the input layer circuit. The values of the vectors from the input layer are unique to the input data. The corresponding output currents from the input layer—and each succeeding layer—are also unique to the input data. The row voltages change across the device according to the changes in the input data.

For some network structures, such as long short-term memory network structures, the architecture of the network includes a multitude of downstream layers receiving inputs from a single upstream layer. For such a network architecture, the corresponding hardware device also includes multiple tiles or arrays of resistive elements corresponding to the required multiple layers of network nodes. For this device structure, the method maps the ranked rows associated with the multiple tiles concatenated in the horizontal direction. This yields the required set of identical tile mappings both receiving identical voltage inputs from a single upstream layer. As described above, as the method maps the rows corresponding to the data array to rows of the device, the method also maps the columns associated with the upstream tile to the inputs of the downstream tile rows.

As an example of the disclosed sorting method, a set of current vectors for row 0-22 of an array are originally presented in order from 0 to 22. After scoring the rows as described, the row order is rearranged from 0-22, to the highest score to lowest score order of: 10, 8, 2, 15, 1, 19, 3, 4, 21, 14, 5, 0, 20, 9, 17, 12, 6, 13, 16, 7, 11, and 18, where row 10 has the highest score and row 18 has the lowest score. The rows are then sorted to segments to balance the overall current for each segment. For the example, the 22 rows are sorted to 8 segments. Each of the 8 segments has 4 rows. The sorting of the 22 rows by score to balance the segment currents yields a row distribution order across the 8 segments of: segment 1: rows 10, 12, 6; segment 2: rows 8, 17, 13; segment 3: rows 2, 9, 18; segment 4: rows 15, 20, 7; segment 5: rows 1, 0, 11; segment 6: rows 19, 5, 18; segment 7: rows 3, 4; and segment 8: rows 4, 21. Application of the sorting process to the circuitry illustrated in FIG. 1 results in changes in the resistance values for variable resistance elements 104 of each row 102 of the circuit. The hardware is not changed, only the resistance values for the variable resistive elements of each row.

Figure 2:
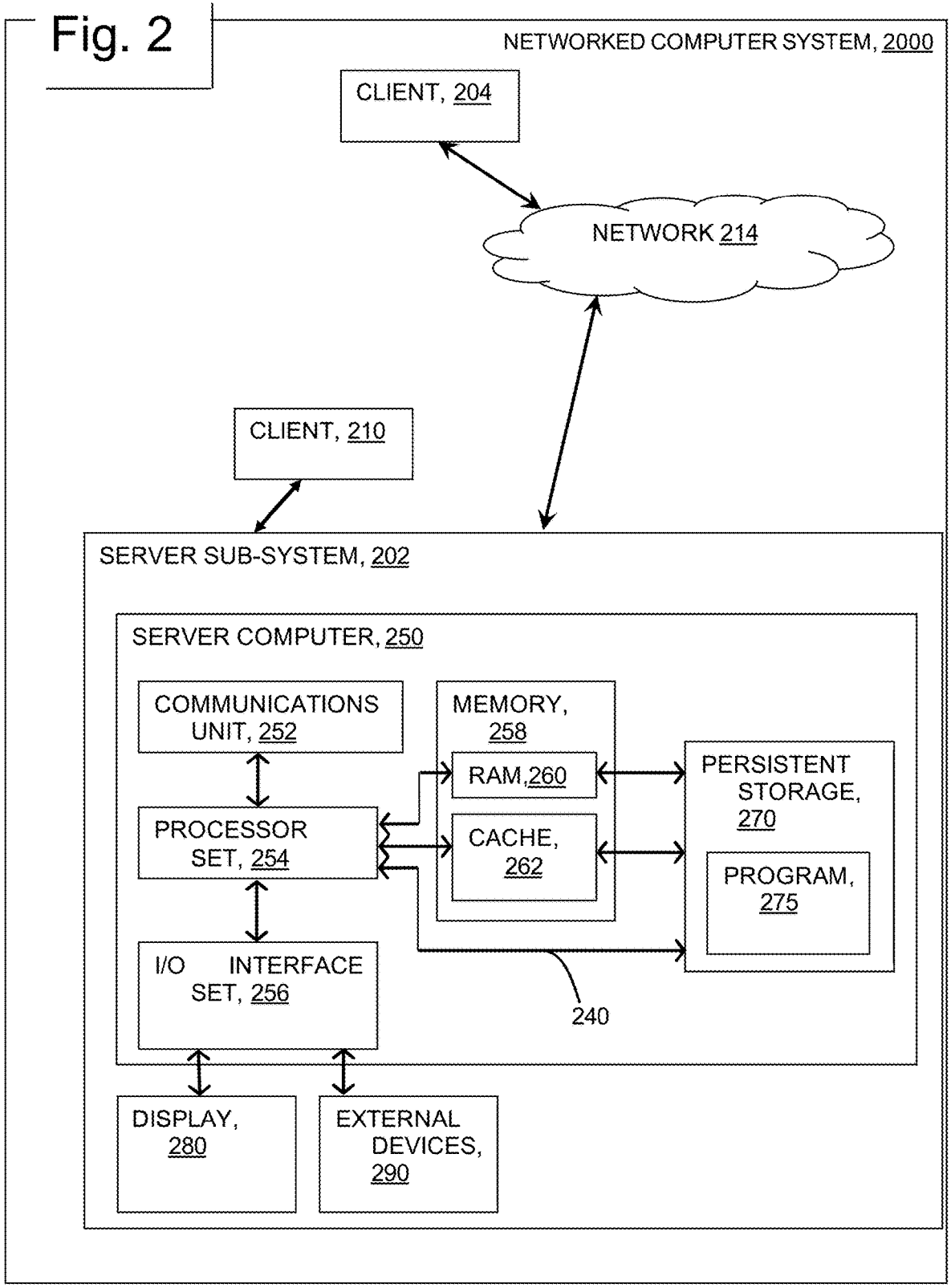
FIG. 2 provides a schematic illustration of a computing environment, according to an embodiment of the invention.

FIG. 2 provides a schematic illustration of exemplary network resources associated with practicing the disclosed inventions. Network resource may perform the steps of the disclosed methods to evaluate input data arrays associated with network weightings and to map rows of weighting values to rows of resistive elements in a hardware device while concurrently mapping columns from an upstream circuit tile or array to correspond with the mapping of the downstream tile rows. Mapping the rows for a complex neural network to a hardware device includes mapping hundreds or thousands of rows per layer across multiple layers and concurrently mapping columns across corresponding upstream arrays. The computations necessary for such mapping may require the use of large amounts of computing power and may require networked resources including edge cloud or cloud resources to efficiently accomplish the mapping in a reasonable amount of time.

The inventions may be practiced in the processors of any of the disclosed elements which process an instruction stream. As shown in the figure, a networked Client device 210 connects wirelessly to server sub-system 202. Client device 204 connects wirelessly to server sub-system 202 via network 214. Client devices 204 and 210 comprise current distribution program (not shown) together with sufficient computing resource (processor, memory, network communications hardware) to execute the program. As shown in FIG. 2, server sub-system 202 comprises a server computer 250. FIG. 2 depicts a block diagram of components of server computer 250 within a networked computer system 2000, in accordance with an embodiment of the present invention. It should be appreciated that FIG. 2 provides only an illustration of one implementation and does not imply any limitations with regard to the environments in which different embodiments can be implemented. Many modifications to the depicted environment can be made.

Server computer 250 can include processor(s) 254, memory 258, persistent storage 270, communications unit 252, input/output (I/O) interface(s) 256 and communications fabric 240. Communications fabric 240 provides communications between cache 262, memory 258, persistent storage 270, communications unit 252, and input/output (I/O) interface(s) 256. Communications fabric 240 can be implemented with any architecture designed for passing data and/or control information between processors (such as microprocessors, communications and network processors, etc.), system memory, peripheral devices, and any other hardware components within a system. For example, communications fabric 240 can be implemented with one or more buses.

Memory 258 and persistent storage 270 are computer readable storage media. In this embodiment, memory 258 includes random access memory (RAM) 260. In general, memory 258 can include any suitable volatile or non-volatile computer readable storage media. Cache 262 is a fast memory that enhances the performance of processor(s) 254 by holding recently accessed data, and data near recently accessed data, from memory 258.

Program instructions and data used to practice embodiments of the present invention, e.g., the current balancing program 275, are stored in persistent storage 270 for execution and/or access by one or more of the respective processor(s) 254 of server computer 250 via cache 262. In this embodiment, persistent storage 270 includes a magnetic hard disk drive. Alternatively, or in addition to a magnetic hard disk drive, persistent storage 270 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 270 may also be removable. For example, a removable hard drive may be used for persistent storage 270. Other examples include optical and magnetic disks, thumb drives, and smart cards that are inserted into a drive for transfer onto another computer readable storage medium that is also part of persistent storage 270.

Communications unit 252, in these examples, provides for communications with other data processing systems or devices, including resources of client computing devices 204, and 210. In these examples, communications unit 252 includes one or more network interface cards. Communications unit 252 may provide communications through the use of either or both physical and wireless communications links. Software distribution programs, and other programs and data used for implementation of the present invention, may be downloaded to persistent storage 270 of server computer 250 through communications unit 252.

I/O interface(s) 256 allows for input and output of data with other devices that may be connected to server computer 250. For example, I/O interface(s) 256 may provide a connection to external device(s) 290 such as a keyboard, a keypad, a touch screen, a microphone, a digital camera, one or more target hardware devices including suitable tiles of resistive elements, and/or some other suitable input device. External device(s) 290 can also include portable computer readable storage media such as, for example, thumb drives, portable optical or magnetic disks, and memory cards. Software and data used to practice embodiments of the present invention, e.g., current balancing program 275 on server computer 250, can be stored on such portable computer readable storage media and can be loaded onto persistent storage 270 via I/O interface(s) 256. I/O interface(s) 256 also connect to a display 280.

Display 280 provides a mechanism to display data to a user and may be, for example, a computer monitor. Display 280 can also function as a touch screen, such as a display of a tablet computer.

Figure 3:
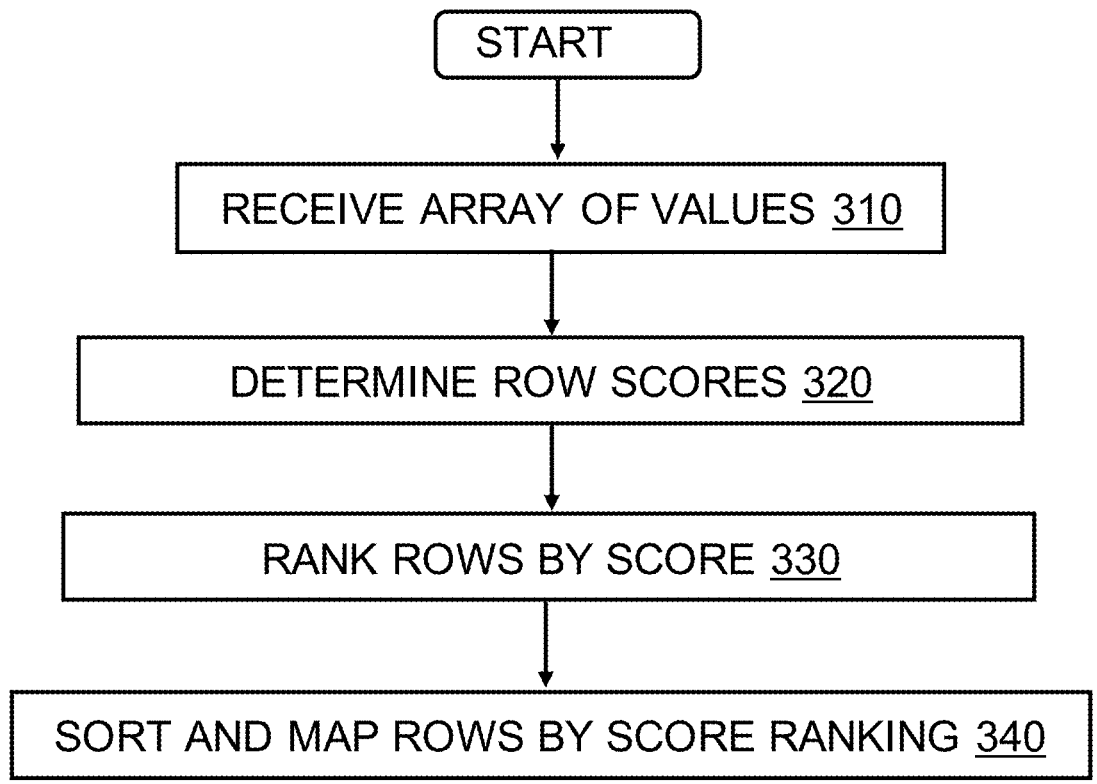
FIG. 3 provides a flowchart depicting an operational sequence, according to an embodiment of the invention.

FIG. 3 provides a flowchart 300, illustrating exemplary activities associated with the practice of the disclosure. After program start, at block 310, the method of current balancing program 275, receives an array or matrix of values. In an embodiment, the values are associated with the network layer weights of a trained neural network. The array may be considered a row-column arrangement of the matrix of values. The method also receives an array vector of input values associated with the array of values. The vector of input values includes a value for each row of the array of values.

At block 320, the method of current balancing program 275 determines a score for each row of values of the received matrix. The score for each row may be associated with the values of the elements of the row, the input values for the row from the input vector, or a combination of the vector and the row values the sum of the product of the value from the vector associated with the row and each element of the row.

At block 330, the method ranks the rows of the array according to the scores determined at block 320. The rows are ranked from the highest score to the lowest score. In an embodiment, the method determines an average aggregate segment row score by summing the complete set of row scores and dividing the total by the number of segments configured in a hardware device to which the method will map the array of values. In this embodiment, the method utilizes the average aggregated segment score as a target for balancing the segment aggregate scores as the sorting algorithm of the method sorts the set of rows from the array of values to the rows and segments of the hardware device.

At block 340, the method sorts the ranked rows and assigns or maps the rows to rows of resistive elements of the designated hardware circuitry. The sorting algorithm balances the aggregate segment row scores to reduce any differences between the aggregate row scores of the respective segments of the hardware circuitry. The method concurrently maps the columns of the preceding circuitry to correspond with the mapping of the rows. For the mapping of the input layer, the method maps the path for input data to the circuitry to match the mapping of the rows.

In an embodiment, the method maps rows of values from multiple arrays to multiple hardware tiles of resistive elements. The arrays and tiles corresponding to the layers of a trained neural network. In an embodiment, the method maps the rows of a single array to the segments of multiple identical tiles to support the use of a hardware design where a single upstream array of resistive elements passes its output as inputs to multiple downstream tiles of resistive elements.

In an embodiment, the method sorts the rows through a number of iterations, each iteration reducing the differences between aggregate segment currents of device columns of resistive elements, aggregate segment row scores, or a combination of these.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
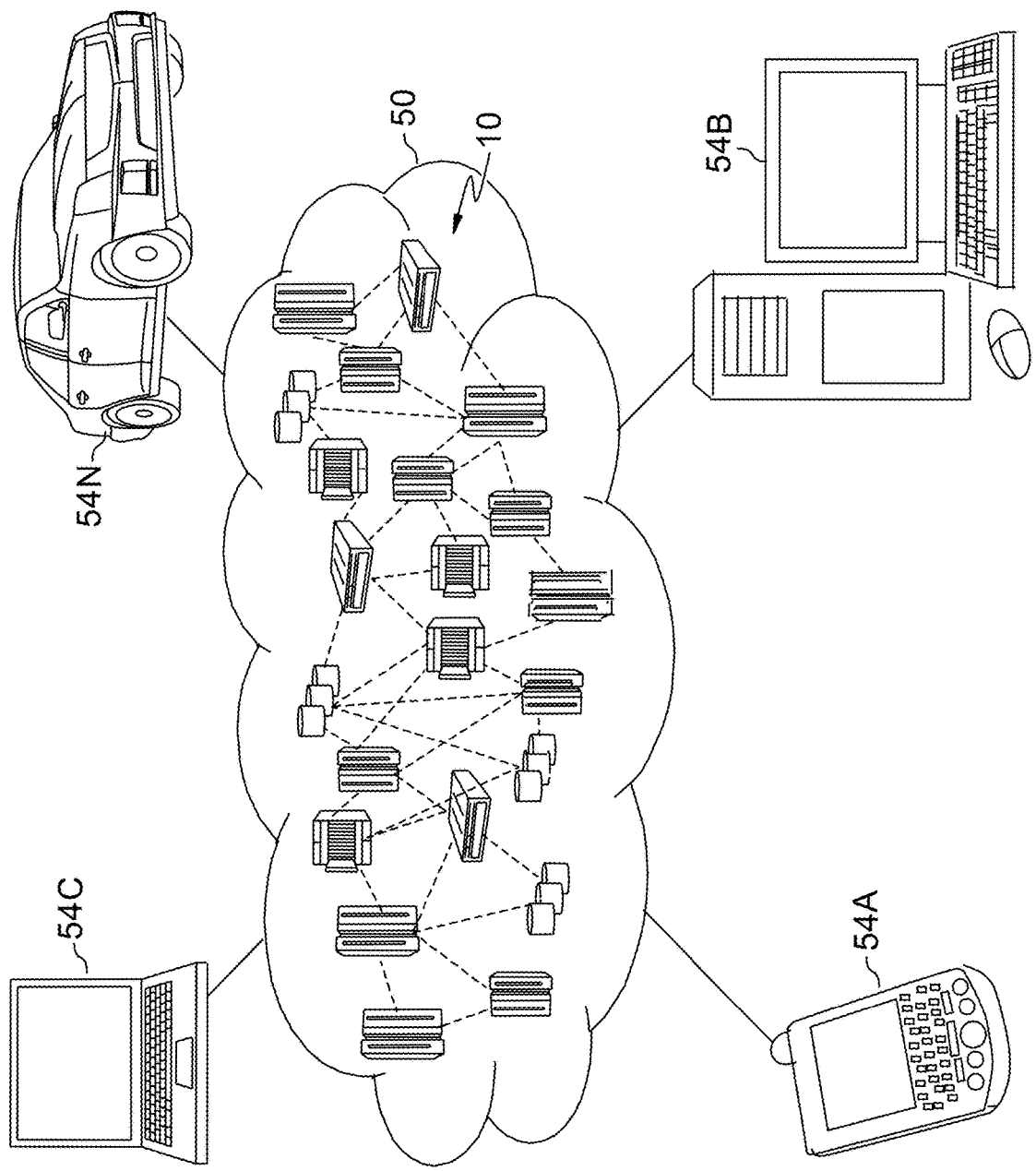
FIG. 4 depicts a cloud computing environment, according to an embodiment of the invention.

Referring now to FIG. 4, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
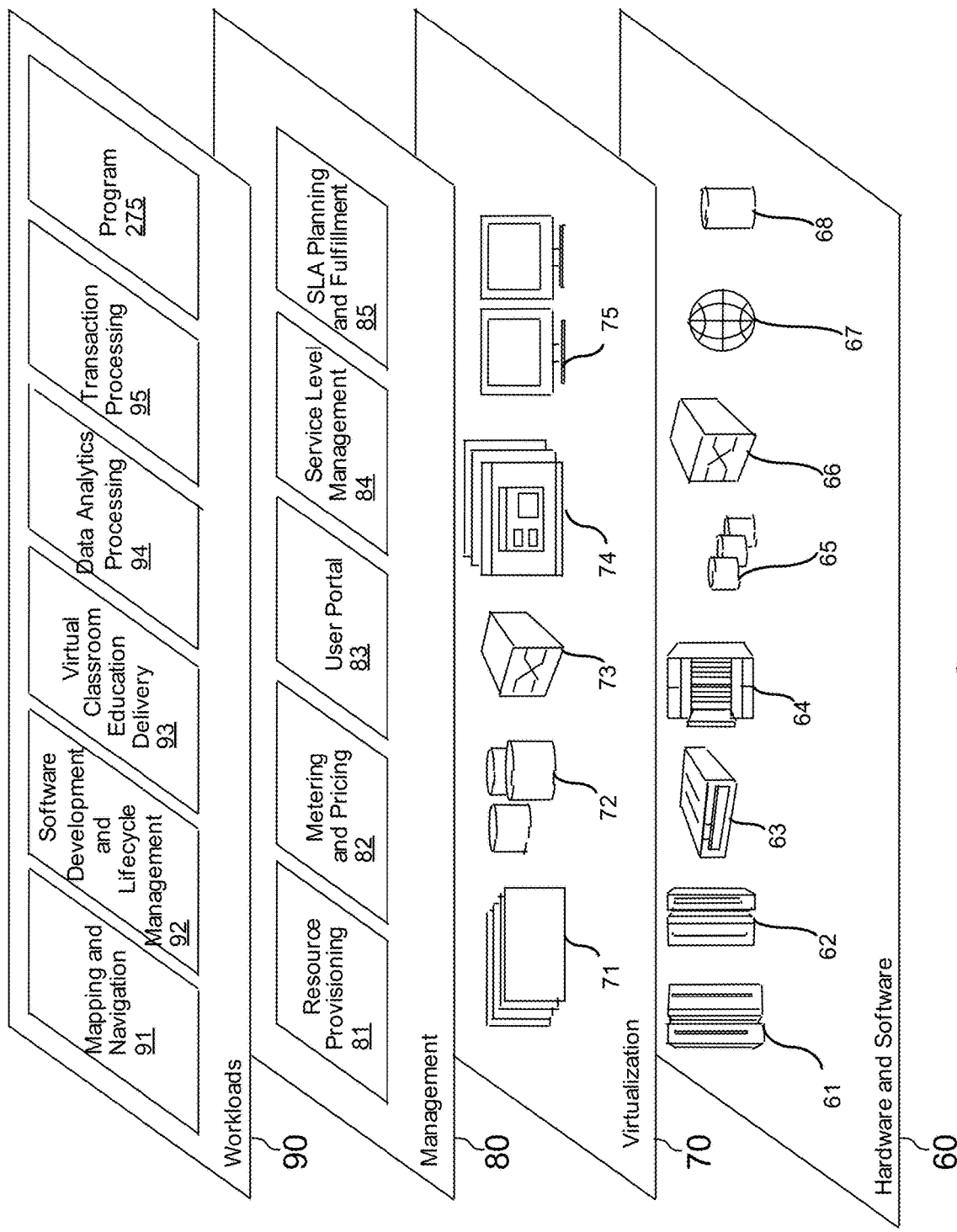
FIG. 5 depicts abstraction model layers, according to an embodiment of the invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and current balancing program 275.

The present invention may be a system, a method, and/or a computer program product at any possible technical detail level of integration. The invention may be beneficially practiced in any system, single or parallel, which processes an instruction stream. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, or computer readable storage device, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions collectively stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for balancing currents within a device including an array of resistive elements, the array including rows and columns, and first stage current mirrors, each of the first stage current mirrors being electrically coupled to a segment, wherein the segment comprises a columnar subset of the resistive elements, the method comprising:
   determining, using the array, a vector of current outputs equal to an analog vector-matrix product between a vector of voltage inputs to the array and a matrix of analog resistive weights within the array, wherein the voltage inputs encode a vector of analog input values, wherein each row of resistive elements corresponds to a specific voltage input;
   determining a score for each of the rows;
   determining a ranking of the rows of the array according to the score of each row; and
   mapping each row to a segment according to the ranking.

2. The method according to claim 1, wherein the voltage inputs are associated with columns of another circuit comprising an array of resistive elements arranged in rows and columns.

3. The method according to claim 1, wherein the resistive elements comprise non-volatile memory elements.

4. The method according to claim 1, wherein the resistive weights correspond to synaptic weights of a neural network.

5. The method according to claim 1, wherein the score of each row is determined using at least one of:
   resistances of elements in that row, or the voltage inputs applied to the resistive elements in that row.

6. The method according to claim 1, further comprising assigning each row to an identical segment of multiple identical circuits.

7. A computer implemented method comprising:
   receiving, by one or more computer processors, an array of values and an associated vector of array inputs, the array comprising rows and columns;
   determining, by the one or more computer processors, a score for each row of the array;
   determining, by the one or more computer processors, a ranking of the rows according to the score of each row; and
   mapping, by the one or more computer processors, the rows to a first circuit comprising an array of resistive elements according to the ranking.

8. The method according to claim 7, wherein the resistive elements comprise non-volatile memory elements.

9. The method according to claim 7, wherein the array of values comprises the synaptic weights of a layer within a neural network.

10. The method according to claim 7, further comprising mapping, by the one or more computer processors, columns of a second circuit according to the mapping of rows.

11. The method according to claim 7, wherein determining the score comprises determining the score according to at least one of array row values and an associated array input.

12. The method according to claim 7, further comprising assigning, by the one or more computer processors, each row to an identical segment of multiple identical circuits.

13. A computer program product for balancing current within a device, the computer program product comprising one or more computer readable storage devices and collectively stored program instructions on the one or more computer readable storage devices, the stored program instructions comprising:
   program instructions to receive an array of values and an associated vector of array inputs, the array comprising rows and columns;
   program instructions to determine a score for each row of the array;
   program instructions to determine a ranking of the rows according to the score of each row; and
   program instructions to map the rows to a first circuit comprising an array of resistive elements according to the ranking.

14. The computer program product according to claim 13, wherein the resistive elements comprise non-volatile memory elements.

15. The computer program product according to claim 13, wherein the array of values comprises synaptic node weights of a neural network.

16. The computer program product according to claim 13, the stored program instructions further comprising program instructions to assign each row to an identical segment of multiple identical circuits.

17. The computer program product according to claim 13, the stored program instructions further comprising program instructions to map columns of a second circuit according to the mapping of rows.

18. A computer implemented method comprising:
   receiving, by one or more computer processors, an array of values and an associated vector of array inputs, the array comprising rows and columns;
   determining, by the one or more computer processors, a score for each row of the array;
   determining, by the one or more computer processors, a ranking of the rows according to the score of each row; and
   mapping, by the one or more computer processors, the rows to a first circuit comprising an array of resistive elements according to the ranking and a columnar segment current.

19. The method according to claim 18, wherein the resistive elements comprise non-volatile memory elements.

20. The method according to claim 18, wherein the array of values comprises the synaptic weights of a layer within a neural network.

21. The method according to claim 18, further comprising mapping, by the one or more computer processors, columns of a second circuit according to the mapping of rows.

22. A computer system for balancing current within a device, the computer program product comprising one or more computer readable storage devices and collectively stored program instructions on the one or more computer readable storage devices, the stored program instructions comprising:
   program instructions to receive an array of values and an associated vector of array inputs, the array comprising rows and columns;
   program instructions to determine a score for each row of the array;
   program instructions to determine a ranking of the rows according to the score of each row; and
   program instructions to map the rows to a first circuit comprising an array of resistive elements according to the ranking and a columnar segment current.

23. The computer system according to claim 22, wherein the resistive elements comprise non-volatile memory elements.

24. The computer system according to claim 23, wherein the array of values comprises synaptic node weights of a neural network.

25. The computer system according to claim 23, the stored program instructions further comprising program instructions to assign each row to an identical segment of multiple identical circuits.

* * * * *